United States Patent [19]
Lin et al.

[11] Patent Number: 5,938,952
[45] Date of Patent: Aug. 17, 1999

[54] LASER-DRIVEN MICROWELDING APPARATUS AND PROCESS

[75] Inventors: Chang-Ming Lin, San Jose; Richard C. Sam, Cupertino, both of Calif.

[73] Assignee: Equilasers, Inc., Santa Clara, Calif.

[21] Appl. No.: 08/787,459

[22] Filed: Jan. 22, 1997

[51] Int. Cl.⁶ .................................................. B23K 26/00
[52] U.S. Cl. ................................ 219/121.64; 219/121.63
[58] Field of Search ......................... 219/121.63, 121.64, 219/121.76, 121.77, 121.83, 121.85, 121.62; 228/4.5, 6.2

[56] References Cited

U.S. PATENT DOCUMENTS

| | | |
|---|---|---|
| 3,718,968 | 3/1973 | Sims et al. . |
| 4,529,115 | 7/1985 | Renshaw et al. .......................... 228/1.1 |
| 4,534,811 | 8/1985 | Ainslie et al. ............................ 156/73.1 |
| 4,598,853 | 7/1986 | Hill .......................................... 228/4.5 |
| 4,693,778 | 9/1987 | Swiggett et al. . |
| 4,718,591 | 1/1988 | Hill .......................................... 228/1.1 |
| 4,845,354 | 7/1989 | Gupta et al. ........................ 219/121.62 |
| 4,893,742 | 1/1990 | Bullock .................................... 228/110 |
| 5,500,502 | 3/1996 | Horita et al. . |
| 5,614,113 | 3/1997 | Hwang et al. ....................... 219/121.64 |

FOREIGN PATENT DOCUMENTS

| | | |
|---|---|---|
| 3831394 | 3/1990 | Germany . |
| 57-175093 | 10/1982 | Japan . |
| 61-039536 | 2/1986 | Japan . |
| 63-79331 | 4/1988 | Japan . |
| 1-199443 | 8/1989 | Japan . |
| 5-102232 | 4/1993 | Japan . |
| 5-347308 | 12/1993 | Japan . |

Primary Examiner—Geoffrey S. Evans
Attorney, Agent, or Firm—Coudert Brothers

[57] ABSTRACT

A microelectronic packaging and interconnection apparatus and method in which dual ball bonds, metal bumps, or TAB bonds are formed by pulsed laser irradiation, but not conventional heating, compression or acoustic (e.g., ultrasonic) methods. A miniature loop forming tool is used to form a metallic wire loop, one end of which is welded to an IC bond pad while the other end of which is welded to an IC package bonding finger, thus forming ball bonds at both ends of the interconnection.

16 Claims, 16 Drawing Sheets

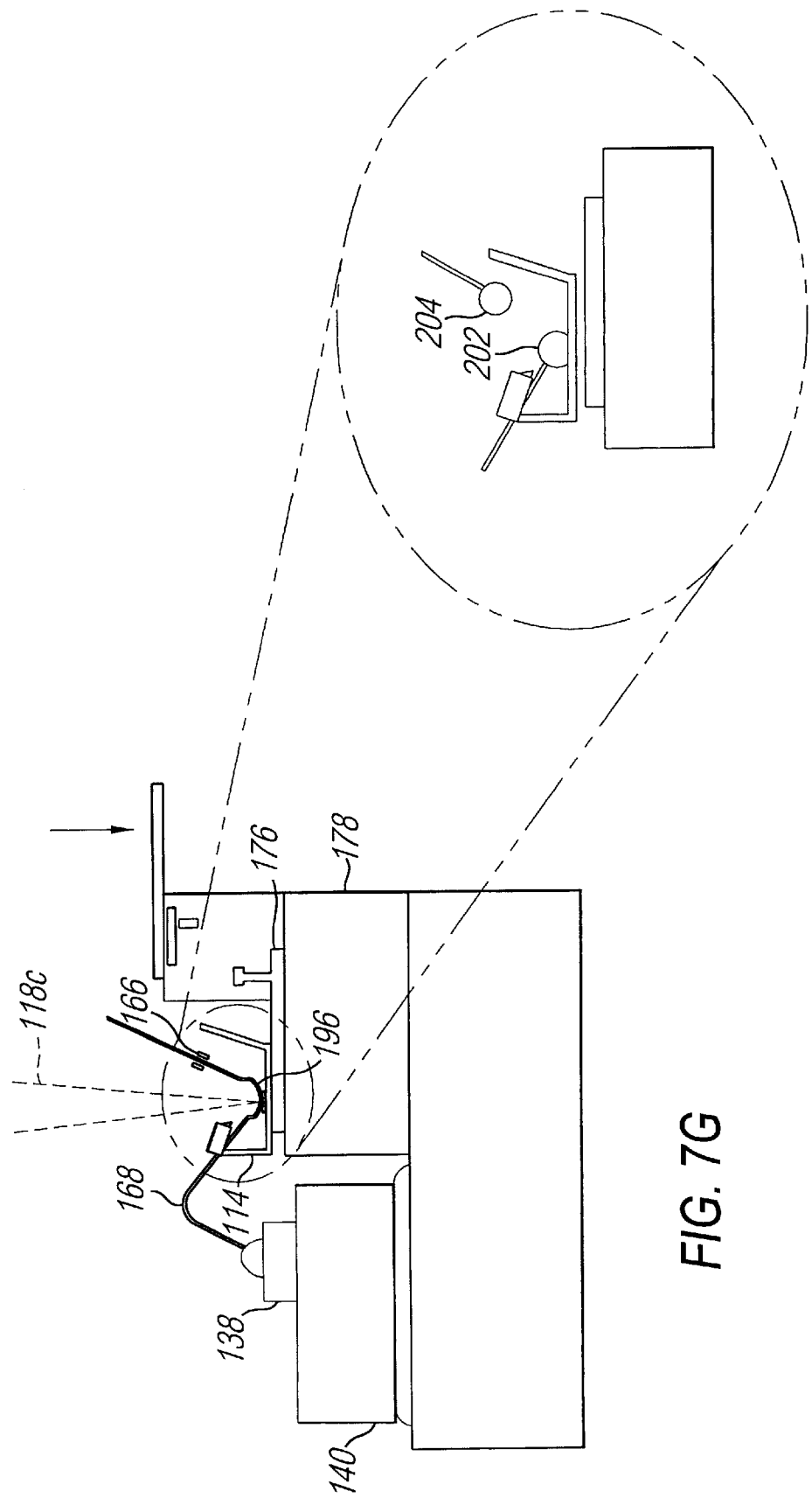

5,938,952

LASER-DRIVEN MICROWELDING APPARATUS AND PROCESS

BACKGROUND OF THE INVENTION

1. Field of the Invention

This invention relates generally to microelectronic packaging and interconnection, and more particularly, to apparatuses and methods in which dual ball bonds, metal bumps or TAB bonds are formed by laser, but not conventional heating, compression or acoustic, means.

2. Brief Description of the Prior Art

Wire bonding has been one of the most important techniques for making microelectronic interconnections. Two types of wire bonding methods are widely used in IC package assembly operations: the gold ball bonding method and the wedge bonding method. The gold ball bonding method, despite being so named, involves the formation of a wire loop with a ball bond at one end but a wedge bond at the other end. This bonding method is only suitable for gold or slightly doped gold wires. On the other hand, the wedge bonding method delivers wedge bonds at both ends of the wire loop and is mostly used for aluminum wire bonding, although gold wires are occasionally used. Generally speaking, between these two methods, the gold ball bonding method delivers better throughput and shorter wire loop length while the aluminum wedge bonding method gives relatively finer bonding pitch.

In either of the above wire bonding methods, mechanical means, e.g., compression or ultrasound, or the combinations thereof, are used to form the ball bonds and the wedge bonds. In addition, thermal energy must be provided to the substrate during a gold ball bonding process. Thus, depending on the specific mechanical means involved, there are two well-established gold ball bonding techniques: thermocompression bonding and thermosonic bonding. In both techniques, thermal energy is supplied by either conventional (e.g., resistive) heating means or laser heating to keep the substrate at an elevated temperature during the formation of the bonds to ensure adequate bonding strength.

For example, U.S. Pat. No. 4,529,115, issued to T. Renshaw et al. and entitled "Thermally Assisted Ultrasonic Welding Apparatus and Process," teaches a conventional thermally assisted ultrasonic bonding device including an electrical resistance coil wrapped around the bonding tip. A limitation of this device is that the thermal mass being heated is very large compared to the specific bonding area. Moreover, an elevated temperature of the thermal mass may not only pose a safety hazard to the operator but also be detrimental to the operability of the adjacent or integral heat sensitive components.

As another example, U.S. Pat. No. 4,534,811, issued to N. Aisnlie et al. and entitled "Apparatus for Thermo Bonding Surfaces," describes a conventional laser-assisted ultrasonic bonding device including a laser and a hollow ultrasonic bonding tip. The combination of heat supplied by the laser and the sonic energy supplied by the bonding tip offers the ability to dynamically provide bonding energy in a short pulse to a limited bonding area. However, the laser component taught in this reference is expensive, complex and incompatible with many modern bonding processes. Excessive ultrasonic forces may also be detrimental to the integrity of electronic components embedded beneath the bonding area. For example, bond pad "cratering" may be caused by either excessive ultrasonic forces or compression.

As further examples, U.S. Pat. No. 4,718,591, issued to W. Hill and entitled "Wire Bonder With Open Center of Motion," discloses an ultrasonic bonding machine having an open center mounting that permits optimum, substantially linear motion of a bonding tip, whereas U.S. Pat. No. 4,598,853, issued to W. Hill and entitled "Open Center Flexural Pivot Wire Bonding Head," discloses a flexural pivot structure useful in an apparatus for bonding thin wire leads in microelectronic circuits.

Attempts have also been made to use thermal energy alone to bond electrical or electronic components. An example is U.S. Pat. No. 3,718,968, issued to Sims et al. and entitled "Method for Connecting a Wire to a Component," which discloses a bonding method including the following steps: deforming the end of a wire by heating it above its melting point with a laser beam and permitting it to solidify into a sphere; placing the sphere in contact with the component; and heating the sphere and the bonding area of the component by a laser beam above their respective melting points to provide a fusion weld between the wire and the component. Essentially, this reference teaches that, to avoid vaporization of the end of the wire before the bonding area is melted, the sphere must be made as large as necessary to provide sufficient reduction in its area-to-volume ratio, and that the duration of laser heating must be long enough to raise the temperatures of both the sphere and the component bonding area above their respective melting points but not above the vaporization point of the sphere. These requirements, however, are over-simplified ones, and are at best a necessary, but not sufficient, condition for successful laser-driven bonding.

Having thus described prior-art technology disclosed in several issued patents, a schematic representation of a conventional, "generic" gold ball bonding apparatus and method is depicted in FIGS. 1A–1E. In FIG. 1A, a wire made of gold or specially doped gold is passed through a bonding tip or "capillary" 12, which is an essential part of the conventional ball bonding apparatus 14. The capillary 12 itself may or may not be heated. An electric spark 16 is used to melt the end of the wire 10 to form a ball 18; this is known as the "electric flame-off" or "EFO" step. The newly formed gold ball 18 is brought to the close proximity of a bond pad 20 on an IC chip (i.e., the substrate) 22, which is typically heated to 300–400° C. A somewhat lower substrate temperature may be used if sonic energy is applied in conjunction with substrate heating.

Next, as depicted in FIG. 1B, the capillary 12 presses the ball against the bond pad 20 during a short ultrasonic pulse to form a gold ball bond 24 in the form of a "nail head," the bottom of which is bonded to the bond pad 20. This is commonly known as the "ball bonding" step.

In FIG. 1C, the capillary 12 is shown lifted from the substrate 22 to allow the newly formed gold ball bond 24 to unreel the wire 10 through the capillary 12.

In FIG. 1D, the capillary 12 is shown moved away from the chip 22 and repositioned above a bonding finger (or lead frame) 26 of an IC package 28; as a result, a wire loop 30 is formed.

Finally, as depicted in FIG. 1E, a wedge bond 32 is formed by shearing the gold wire on the bonding finger 26 of the IC package 28; that is, the capillary 12 presses the gold wire against the bonding finger 26 and moves essentially horizontally away from the bonding finger 26. The capillary 12 is then raised while a small length of wire is unreeled. A prior-art electromagnetic wire clamp (not shown) is actuated to break the wire at the neck of the wedge 32, leaving a flattened tail adhering to the bonding finger 26. Thus, the IC bond pad 20 and a bonding finger 26 are electrically connected through the gold wire loop 30, one end of which is connected to the IC bond pad 20 via a ball bond 24 while the other end is connected to the bonding finger 26 via a wedge bond 32. This wire bonding process can be repeated for the connection of the remaining bond pads of the IC chip to the corresponding bonding fingers of the IC package, creating a completed and functional IC device.

The aforementioned ball bonding apparatus and method works fairly well for wires made of soft metals such as gold. However, many problems do occur. First, to allow the wire to pass through its center, the conventional capillary is usually quite bulky, setting a limit on the finest bonding pitch achievable with the gold ball bonding technique. Second, the EFO step often damages the capillary and significantly shortens the useful life of the capillary. Third, to ensure good contact between the wire and the bonding surface at a wedge bond, the capillary generally has to make a low-entry-angle motion relative to the bonding surface. This low angle necessarily entails a longer wire loop and longer "interpad" distance between the bond pad of the chip and the bond pad or bonding finger of the package than if the wire loop could come down at the package bonding plane at a greater entry angle, i.e., closer to 90°. Fourth, because the IC chips are subjected to substrate heating and mechanical stress caused by compression or ultrasonic forces, various forms of IC chip damages may occur, resulting in a lower overall yield. If wires made of metals possessing greater hardness and higher melting points, such as copper or palladium, were used, the overall yield would be even lower, because higher substrate temperature and more mechanical energy would be required to achieve bonding. In fact, such IC damage and yield problems have practically prevented fine copper or palladium wires from being widely used in wire-bonded microelectronic packages, even though these metals are both electrically better (e.g. greater electromigration resistance) and mechanically stronger than gold. This limitation of conventional wire bonding is well documented in the literature.

Note that, compared to the above ball bonding method, the conventional wedge bonding method requires an even greater interpad distance because of the low entry angles dictated by the wedge bonds at both the chip bond pad and the package bond pad.

The aforementioned conventional gold ball bonding method can be modified to produce gold bumps on an IC chip. Such gold bumps may be used in attaching the IC chip directly to a circuit board or an IC package (either a ceramic package, plastic package, or a flexible circuit board) via the flip-chip method, or in other advanced packaging assembly applications such as MCM (multichip module), MEMS (mechanical-electronic microsensor), and hard disk assembly.

FIGS. 2A–2C depict this conventional "metal stub" method for gold bump formation. In FIG. 2A, a gold ball 18 is formed by the aforementioned EFO process. The newly formed ball 18 is then brought in contact with a bond pad 20 of an IC chip 22; see FIG. 2B. A ball bond 24 in the form of a nail head is produced on the bond pad by the aforementioned ball bonding step. As shown in FIG. 2C, the capillary 12 is raised to unreel a small length of wire 10. A prior-art wire clamp 16 is then electromagnetically actuated to break the wire 10 right above the nail head 24, leaving a gold bump having a short and sharp tail 34. The above steps depicted in FIGS. 2A–2C may be repeated to generate gold bumps on all of the bond pads of the IC chip so that the bond pads can be directly attached to a circuit board or other connecting structures via the bumps.

Similar to the above formation of ball bonds between an IC chip and gold wires in the conventional ball bonding method, the substrate in the aforesaid prior-art gold bumping method is generally kept at an elevated temperature and subjected to vicious mechanical compression and shear to ensure acceptable bond strength. Thus, the IC damage and yield problems cited above for the conventional ball bonding method persist in this conventional gold bumping method as well. Furthermore, because the finished gold bumps have uncontrolled sharp tails due to the nature of metal fracture, additional planarization processes are generally required to flatten these sharp tails before the chip can be attached to a circuit board or another structure via, e.g., the flip-chip process. Finally, the average height of finished gold bumps produced by this conventional gold bumping process is usually several mils tall, making this process unsuitable for today's miniaturized IC packaging assemblies.

Another microelectronic packaging technique that has showed great promises is the tape-automated-bonding (commonly dubbed TAB) assembly process. TAB was originally developed as a highly automatic technique for packaging large volume, low I/O devices, but has since been applied to high I/O devices (more than 300 I/O connections) as well. Typically, the TAB process involves the use of thermal compression bonding to bond silicon chips to metal (e.g., copper) strips deposited and patterned on a polymer (e.g., polyimide or Mylar) tape. Thus, TAB technology is generally considered as both a chip connection method and a first-level packaging technique.

A typical example of a TAB tape 40 currently used in package industry is shown in FIG. 3A. This TAB tape 40 consists of laminated and patterned copper leads 42 glued to prepunched high-temperature polymer film 44. The copper leads 42 may also be coated with an electroplated solder layer to optimize the TAB bonding operation and provide better corrosion resistance. This solder electroplating process requires that all copper leads be shorted to electrode contact points. This adversely affects the usable area on the tape, and additionally, may require a special cutting or punching operation to delete common connections where it is desirable to test Inner Lead Bonding (ILB) bonded devices prior to Outer Lead Bonding (OLB).

In principle, to bond IC chips to a TAB tape, bump contacts can be made on either the IC chip or the TAB tape. However, formation of bumped TAB tapes is rather complicated and expensive. This makes the use of bumped chip the method of choice for TAB bonding.

An example of a conventional bumped chip TAB bonding process is illustrated in FIG. 3B. Through a series of time-consuming and labor-intensive processes, including thin film deposition, photoresist coating, photolithography alignment and exposure, development of photoresist, solder electroplating, post-plating etching, etc. Solder bumps 46 are generated on the IC chips 48 while the chips 48 are still in wafer form. Subsequently, the bumped wafer is examined and sawed to liberate each individual IC chip 48. These IC chips 48 are then transferred onto a sticky or wax layer 50 attached to a polymer tape carrier 52. These bumped IC chips 48 are affixed to the copper leads 42 of the TAB tape 40 as follows. First, the tips of the copper leads 42 are visually aligned to the corresponding solder bump contacts 46 of the IC chip 48 via an optical alignment system. Then, the copper leads 42 are compressed down against the solder bump contacts 46 and heated by a resistive heating block 54, with or without ultrasound, forming bonding between each copper lead 42 and its corresponding solder bump contact 46. Alternatively, as shown in FIG. 3C, the resistive heating block 54 can be replaced by a hollow capillary 56 to accommodate a low-power laser beam 58 which provides heat needed for the lead-to-bump bonding.

As an example, U.S. Pat. No. 4,893,742, issued to P. Bullock and entitled "Ultrasonic Laser Soldering," teaches a "flux-less" TAB laser soldering apparatus, where an elongated ultrasonically vibratable capillary is employed to press the wire down against its pad and to receive and guide an optical fiber through which a beam of laser energy is fed coaxially through the capillary to heat the wire end.

In addition to possibly excessive heating and mechanical stress, a severe limitation of the conventional TAB bonding technique is that the unbumped areas of the copper leads and the IC chip must generally be masked with a patterned photoresist layer prior to solder plating. This requires additional care, process steps, and process time. Furthermore, either the TAB tape or the IC chip, or both, are exposed to undesirable wet chemicals during the photolithographic masking process and the electrochemical plating process. Thus, the conventional TAB bonding method has been regarded by many skilled in the art as a messy, complex, and time-consuming process. Such complexity of the conventional TAB process also entails a significantly higher operational cost than wire bonding methods, preventing the TAB technique from being widely accepted by the cost-conscious microelectronic packaging industry.

The aforesaid problems, i.e., substrate damage caused by thermal and mechanical means, reduction in the overall yield, damage to the capillary, needs for photolithographic masking and electroplating, etc., will become worse and worse as the size of IC chips moves towards miniaturization; that is, I/O pads and transistors shrink in size and increase in density. Hence, there is a need in the art for a microwelding apparatus and process which allows finer pitch bonds and bumps without the need for photolithographic masking, electrochemical plating, or excessive heating, compression or ultrasonic vibration.

All of the patents mentioned above are hereby incorporated by reference for purposes of additional disclosure.

SUMMARY OF THE INVENTION

Accordingly, it is an object of the present invention to provide a ball bonding apparatus and process suitable for high-bonding-strength, short-interpad-distance, fine-pitch microelectronic packaging without the use of substrate or package heating or conventional mechanical means, e.g., ultrasound, compression or shearing.

Another object of the present invention is to provide a ball bonding apparatus and process which allows the use of wires made of hard or high-melting-point metals, e.g., copper or palladium.

Still another object of the present invention is to provide an improved metal bumping apparatus and flux-less bumping process for generating fine metal bumps requiring none of the following: substrate or package heating, use of ultrasound or compression, and postbumping planarization.

Yet another object of the present invention is to provide a metal bumping apparatus and process which enables the formation of bumps made of metal other than gold, e.g., copper, palladium, molybdenum, or solder alloys.

A further object of the present invention is to provide a simplified TAB apparatus and flux-less bumping process for bonding IC chip bond pads to the TAB tape without the use of any of the following: photolithographic masking, eletrochemical plating, acoustic energy, compression stress, and substrate or package heating.

Still a further object of the present invention is to eliminate several problems including substrate overheating, bond pad cratering damage, and bonding tip damage, all of which are commonly associated with conventional gold ball bonding, metal stub bumping, and TAB assembly processes.

Yet a further object of the present invention is to increase the overall yield of microelectronic packaging by providing an improved laser-driven bonding apparatus and process.

According to one aspect of the present invention, the end of a wire made of gold, copper, palladium or other materials is melted into a ball, and the ball is welded to a bond pad of a microelectronic component (e.g., an IC chip) through the use of pulsed high-energy laser irradiation. No capillary-type bonding tip, electric flame-off, substrate heating, or ultrasound or compression is used in this new bonding process. A miniature loop forming tool is used to form a wire loop, one end of which is welded to the aforesaid bond pad and the other end of which is welded to a bond pad of another microelectronic component (e.g., an IC package), again through the use of the aforesaid pulsed high-energy laser irradiation. A ball bond, instead of wedge bond, is formed at each end of the wire connecting the microelectronic components, resulting in an interpad distance well-suited for miniaturized microelectronic packaging. Because the amount of superfluous heat is greatly reduced in comparison to conventional bonding techniques, very little thermal damage to the microelectronic components takes place, nor is there much formation of interfacial intermetallic compounds at the microwelding area.

According to another aspect of the present invention, a first pulsed high-energy laser irradiation is used to locally melt and deform the end of a conductor wire made of gold, copper, palladium, molybdenum, solder or other materials. A second laser irradiation is used to turn the deformed wire end into an essentially hemispherical bump on the surface of a bond pad of a microelectronic component (e.g., an IC chip) and to form a strong alloy bond between the bump and the bond pad. A wire clamping tool or a third laser irradiation is used to break the wire right above the bump; the use of the laser has the advantage of restoring the bump into an essentially hemispherical shape without additional planarization.

In according with yet another aspect of the present invention, pulsed high-energy laser irradiation is used to form a copper ball at the tip of each copper lead of a standard TAB tape. The copper balls and the matching bond pads of a microelectronic component (e.g., an IC chip) are brought into contact, followed by another pulsed high-energy laser irradiation to form a strong alloy bond between each copper ball and its corresponding bond pad. No lithographic or electroplating processes are involved in this new TAB bonding process.

An advantage of the present invention is that the new ball bonding apparatus and process can produce microelectronic packaging with high-strength, high-reliability gold, copper or palladium ball bonds at both the chip and the package end, without the need for sophisticated mechanical means and without suffering substrate damage or overall yield reduction.

Another advantage of the present invention is that the new ball bonding apparatus and process can produce shorter wire loops and allow shorter interpad distances, thus reducing the dimensions of microelectronic packages and facilitates the use of advanced packaging techniques in applications such as MCMs and MEMS.

Still another advantage of the present invention is that it is possible to use a coated magnetic or conductive wire because the concentrated laser energy can evaporate the polymer coating of such a wire at the microwelding spot and create a direct contact between the wire itself and the target substrate.

Another advantage of the present invention is that the new flux-less metal bumping apparatus and process can produce metal bumps with well-controlled dimensions suitable for advanced IC interconnect techniques such as flip chips or the fabrication of ball/bump grid array (BGA) packages.

Yet another advantage of the present invention is that the new TAB apparatus and process can produce high-strength TAB assemblies without costly and messy lithographic masking and electrochemical plating processes required by conventional TAB processes.

A further advantage of the present invention is that it generally consumes less thermal energy compared with prior-art bonding and bumping methods.

Still a further advantage of the present invention is that the laser microwelding approach is relatively insensitive to bond pad surface contamination because localized laser power helps clean up the bond pad surface.

Yet a further advantage of the present invention is that single-metal bumps can be made to replace solder bumps in BGA packages and other similar packages, thus not only greatly simplifying the reflow process dictated by the use of solder, but also improving the performance at electrical joints.

Another advantage of the present invention is that not only metals but other inorganic or organic materials may be used in the new bonding process, e.g., connecting an optical glass fiber to an optoelectronic package.

These and other objects, features and advantages of the present invention will no doubt become apparent to those skilled in the art after having read the following detailed description of the preferred embodiments which are illustrated in the several figures of the drawing.

BRIEF DESCRIPTION OF THE DRAWING

FIGS. 7A–7J are schematic illustrations of a laser-driven dual-ball bonding process in accordance with the present invention;

DESCRIPTION OF THE PREFERRED EMBODIMENTS

While the present invention may be embodied in many forms, details of the preferred embodiments are schematically shown in FIGS. 4–9, with the understanding that the present disclosure is not intended to limit the invention to the embodiments illustrated.

In one specific embodiment of the present invention, a conventional wire bonding apparatus, similar to the one depicted in FIG. 1, is modified to provide an improved laser-driven microwelding apparatus in which wire bonding between elements, e.g., IC chips, conductor wires and electronic packages, is driven essentially by laser and not by substrate heating or extraneous mechanical means, e.g., compression, ultrasound or shearing. Alternatively, the new laser-driven microwelding apparatus may be specifically built in the manner taught below, with a laser being the exclusive energy source for wire bonding.

There are three essential subsystems in the new laser-driven microwelding apparatus, i.e., a coupled laser source/focusing/monitoring subsystem, a precision displacement subsystem, and a loop-forming tool. FIG. 4, FIGS. 5A and 5B, FIG. 6, and FIGS. 7A–7J respectively and collectively, illustrate several aspects of these subsystems as well as how they function in conjunction with one another.

Figure 1A:
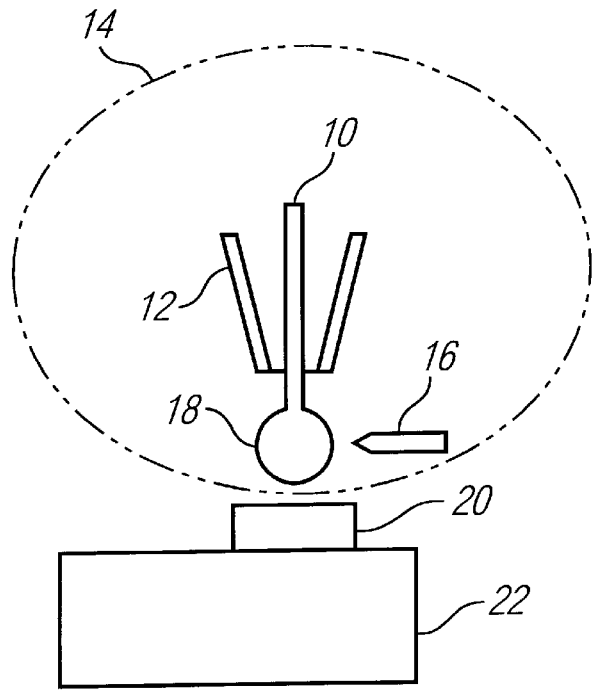
FIGS. 1A–1E are schematic illustrations of a conventional prior-art wire bonding process.
Figure 1B:
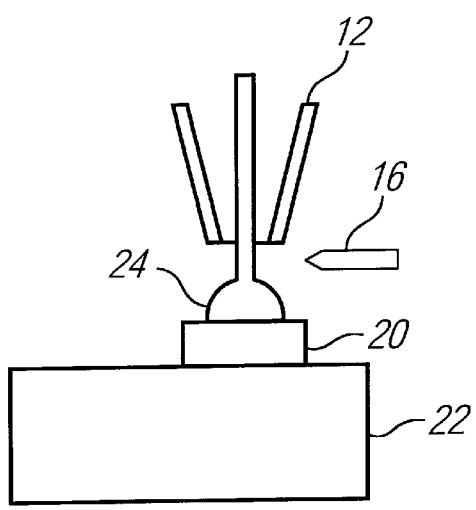
Figure 1C:
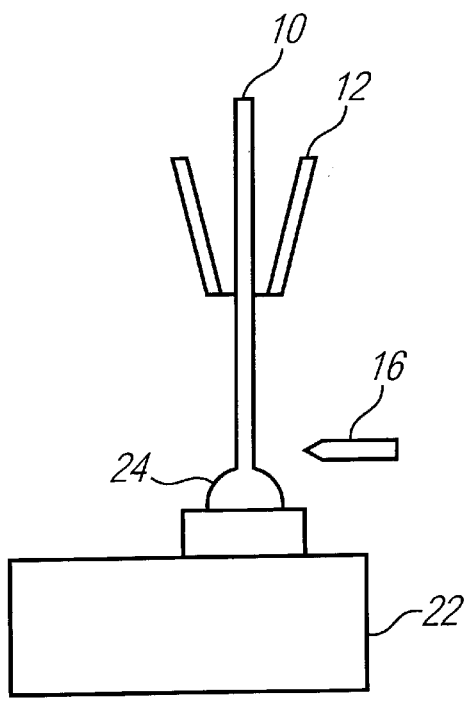
Figure 1D:
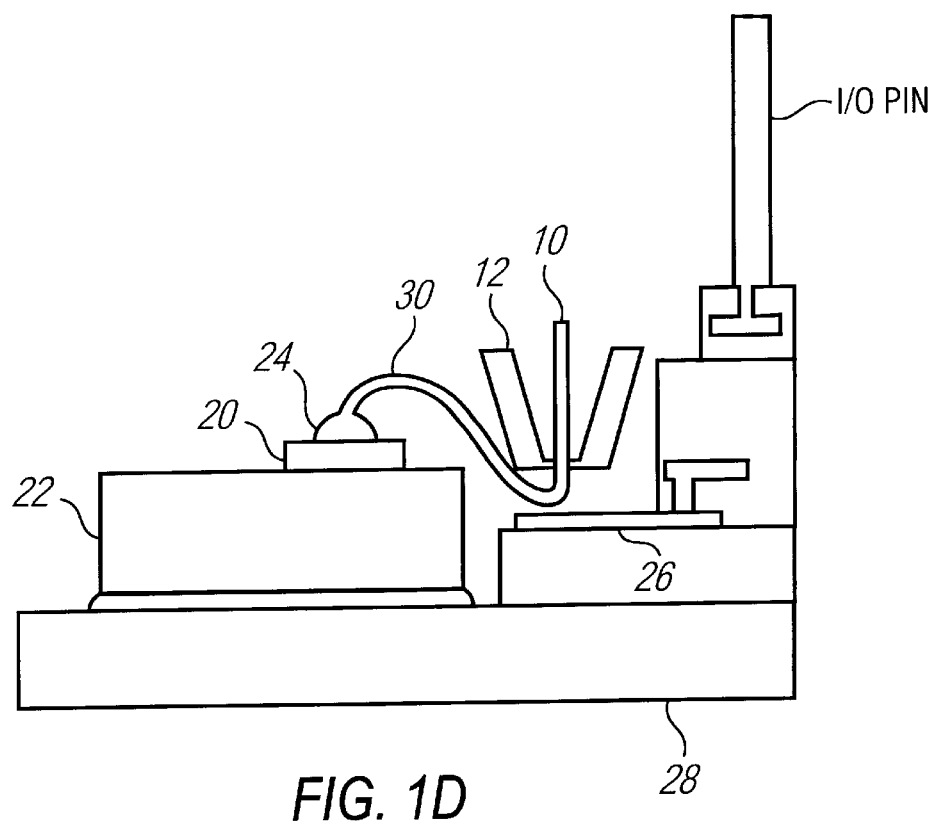
Figure 1E:
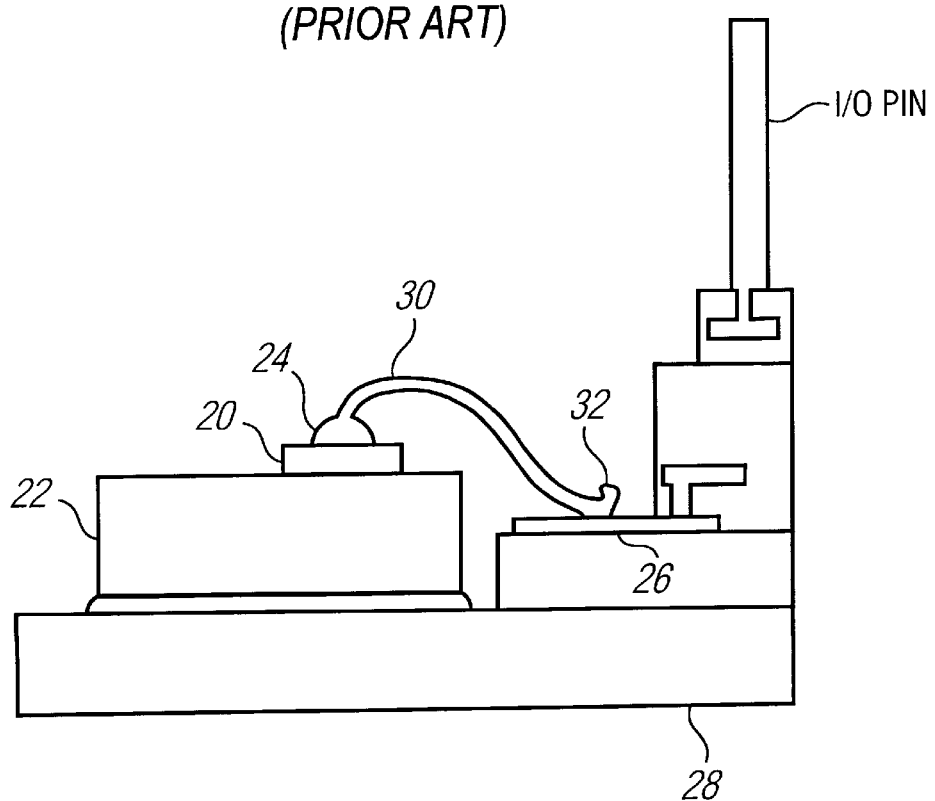
Figure 2A:
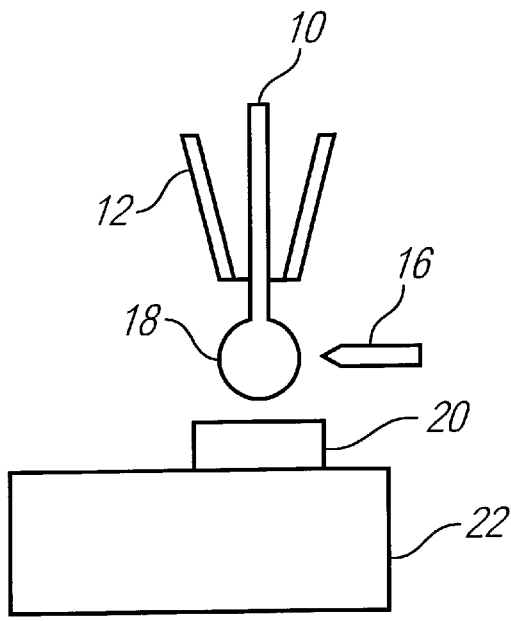
FIGS. 2A–2C are schematic illustrations of a conventional prior-art metal bumping process.
Figure 2B:
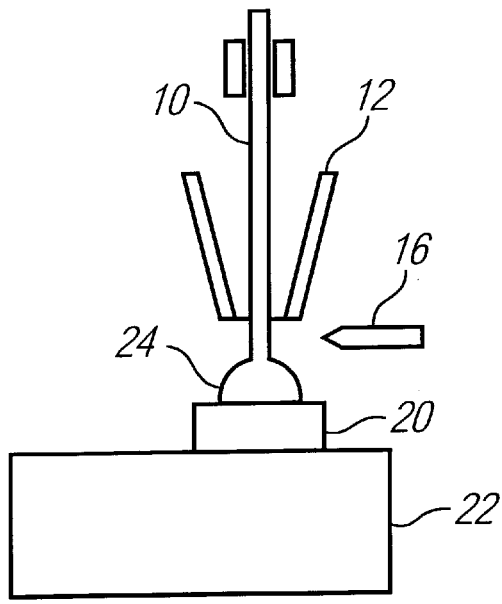
Figure 2C:
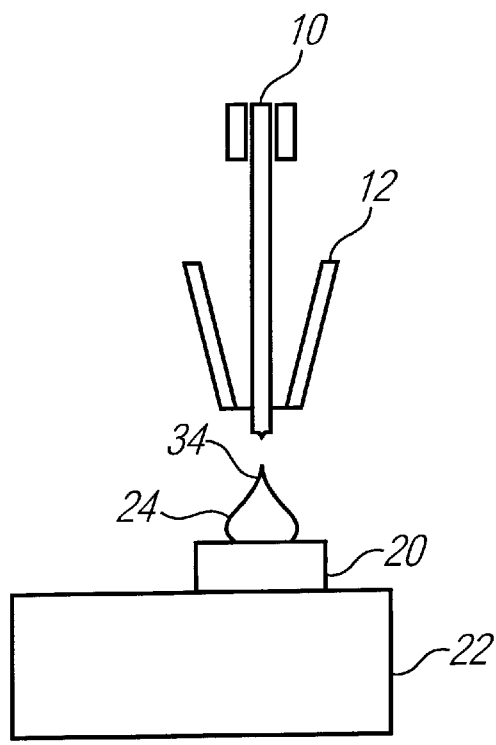
Figure 3A:
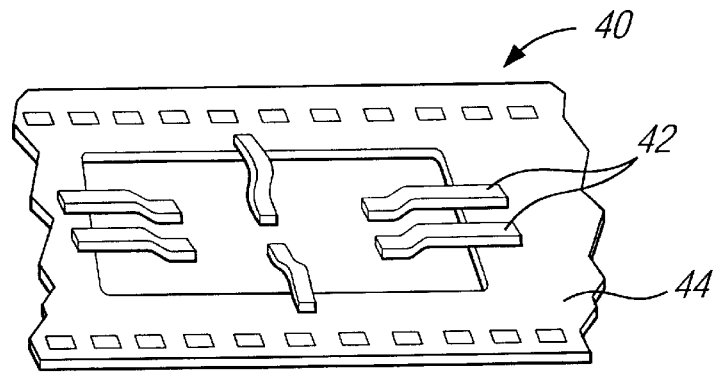
FIGS. 3A–3C are schematic illustrations of a conventional prior-art TAB assembly process.
Figure 3B:
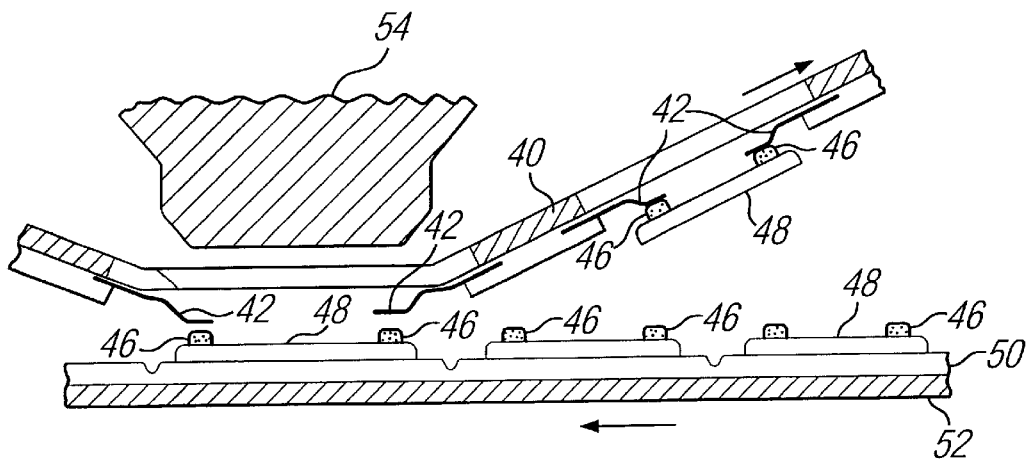
Figure 3C:
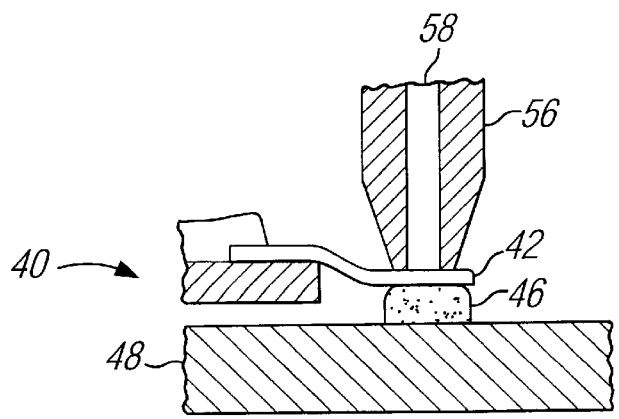
Figure 4:
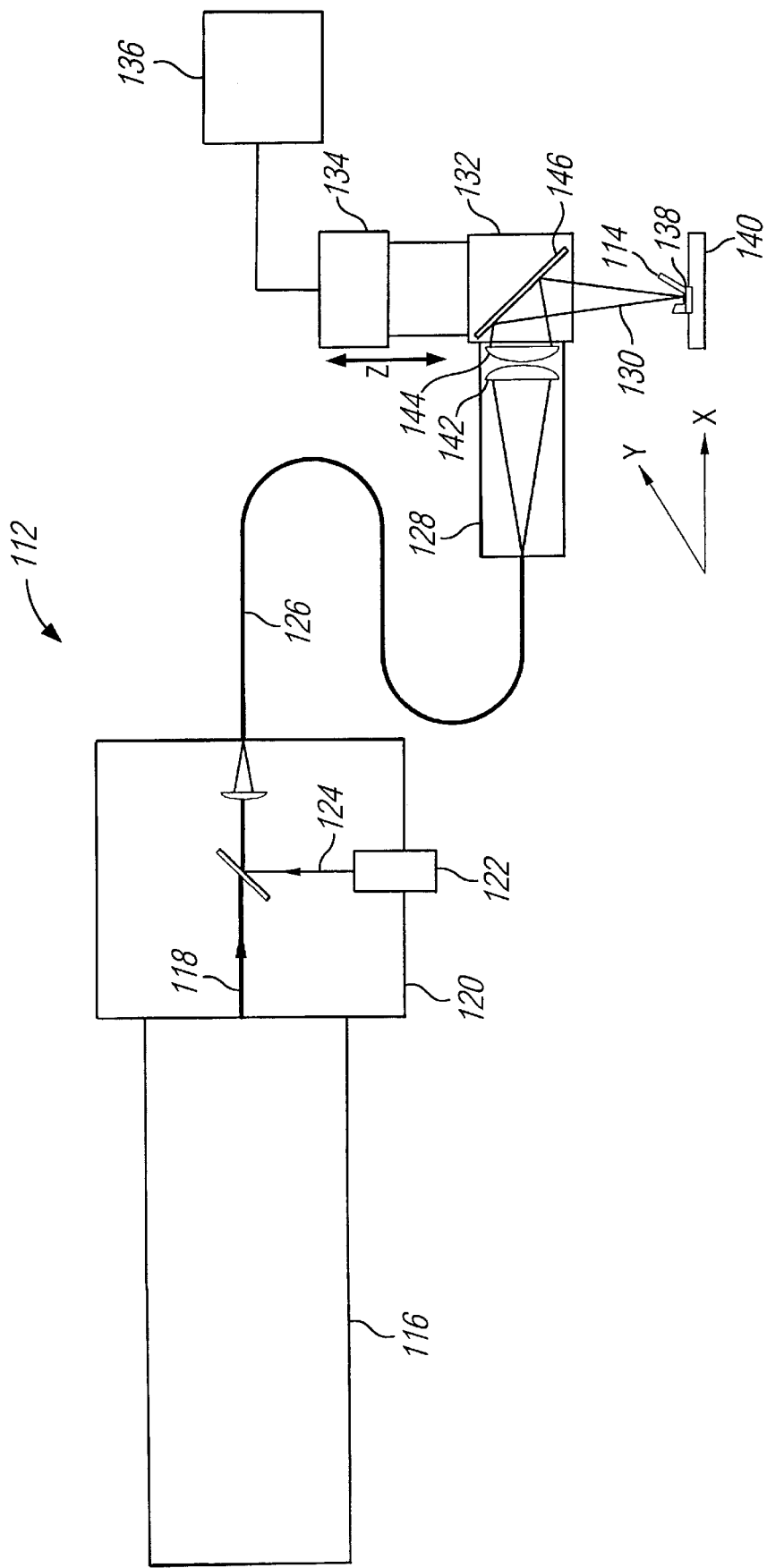
FIG. 4 is a schematic representation of an optical setup of a laser-driven microwelding system in accordance with the present invention.

Referring to FIG. 4, the laser-driven microwelding apparatus comprises a prior-art wire bonding apparatus known to one skilled in the art (not shown), and a coupled laser source/focusing/monitoring subsystem 112 of the present invention. Also shown in FIG. 4 is a loop-forming tool 114. This subsystem 112 includes a laser source 116 generating a confined pulsed laser beam 118, an optics compartment 120, a second laser source 122 generating a second laser beam 124, an optical fiber 126, and a beam imaging assembly 128. The coupled laser beam 130 emitted from both laser sources 116 and 122 is transmitted through a beamsplitter compartment 132, a monitoring system consisting essentially of a camera 134 and a monitor 136, and a prior-art Z-axis linear precision displacement motor (not shown) coupling the positioning of the laser beam 130 with the X,Y-axis linear precision displacement of a substrate 140.

Referring again to FIG. 4, the laser source 116 is capable of generating on demand laser pulses 118, which, in combination with laser beam 124, are delivered to a bond pad 138 of the substrate 140 via optical fiber 126, laser beam imaging assembly 128 and beamsplitter compartment 132. With such laser pulses, a conductor wire made of, e.g., gold, copper or gold, may be melted and amalgamated with aluminum bond pad 138 at the microwelding spot. These laser pulses should, on the one hand, deliver sufficient thermal energy to the bonding area for microwelding purposes and, on the other hand, maximize the efficient use of thermal energy by rapidly heating mainly the microwelding spot and minimize the amount of thermal exposure to the IC substrate 140.

Among commercially available lasers, the pulsed Nd:YAG laser is emitting at 1.064 $\mu$m (micrometers) particularly suitable as the laser source 116, although other laser sources may also be used. Two convenient sources for such Nd:YAG lasers are Equilasers, Inc. (Sunnyvale, Calif.) and Miyachi Co, (Tokyo, Japan). For example, Equilasers Model EDW-15, having a energy rating of 150 mJ–12 J, is particularly suitable for the purpose of the present invention. Depending on the bonding materials, the laser source 116 may deliver a laser beam with a power density ranging from approximately $1 \times 10^3$ to $8 \times 10^6$ W/cm$^2$ over a duration ranging from a few microseconds to a few milliseconds. For example, when microwelding a copper wire to an aluminum bond pad, the laser source typically provides laser power density at a density approximately $4.7 \times 10^5$ W/cm$^2$ for approximately 0.5 millisecond. Thus, laser energy used for ball bonding involving a 1.3-mil diameter copper wire is approximately 0.30. Joule per pulse. The amalgamated Cu—Al ball bonds thus generated have a bond strength far exceeding $5 \times 10^7$ dyne/cm$^2$, which is much greater than 15 grams per ball bond. This strength is comparable to the bulk Cu—Al alloy strength, and is far superior to typical gold—gold or gold-aluminum ball bonds generated by a typical thermosonic bonding tool, where the bond strength can be as low as 3 grams. This is mainly because problems of interfacial adhesion integrity and intermetallic compounds, which so often plague gold or gold-aluminum ball bonds, is not a threat in copper-aluminum ball bonds. There is no sign of necking, i.e., narrowing of the wire near the ball bond, either. In addition, because of the short duration of the laser pulse, substrate heating is minimized, resulting in virtually no substrate damage except for, occasionally, a faint radiant recrystallization morphology around the ball bond. If necessary, this radiant morphology can be further mitigated by minor engineering effort, e.g., keeping the laser power parameters, i.e., laser energy, welding duration, etc., at their respective optimum values.

The main purpose of the second laser source 122 in FIG. 4 is to provide an aiming beam 124 so that the high-energy laser beam 118 from the first laser source 116 can be accurately positioned and focused at the bond pad 138. Another purpose of the second laser source 122 is that the laser beam 124 emitted therefrom can assist the positioning of the loop forming tool 114 during the bonding operation. A laser well-suited for this purpose is a visible (e.g., red) laser diode, which is commercially available from companies such as SDL, Inc. (San Jose, Calif.) and Opto-Power Co. (Tucson, Ariz.). The optical compartment 120 includes a beam splitter, a photodiode detector, and a lens system, all of which, collectively, couple the laser beam 118 from the first laser source 116 with the laser beam 124 from the second laser source 122. The two input laser beams may be coupled in a number of ways; for example, they may be superimposed. The coupled laser beam 130 is then transmitted through the optical fiber 126 and emitted from the distal end to the beam imaging assembly 128.

The beam imaging assembly 128 includes a pair of lenses 142 and 144, which image the laser beam 130 from the optical fiber into a small spot in the conjugate position. The imaging ratio, i.e., the ratio of the incoming to focused beam sizes, may be varied to yield different image sizes. For the best result, the imaging ratio for the present application is preferably in the range of 1:1 to 2:1.

The beamsplitter compartment 132 is attached to the beam imaging assembly 128 and contains a beamsplitter 146. By properly adjusting the transmittance and reflectance of the beamsplitter 146, as known to those skilled in the art, the beamsplitter 146 can be made to reflect almost 100% of the high-energy laser beam and approximately 50% of the visible aiming beam towards the microwelding spot. The entry angle of the laser beam with respect to the surface of the substrate 140 should be so chosen that the beam will not cause a safety hazard to the operator of the microwelding apparatus.

Approximately half of the visible aiming beam 124 reflected from the microwelding spot reaches the camera (e.g., a CCD camera) 134, due to the 50% transmission efficiency of the beamsplitter 146. The CCD camera 134 captures a view of the substrate 140, on which the aiming beam 124 is also focused through the beamsplitter 146. This view may be continuously displayed on the monitor 136 and used for aligning the laser beam 130 with the microwelding spot.

The beam imaging assembly 128, the beamsplitter compartment 132 and the CCD camera 134 may conveniently all be packaged in an assembly 135 (shown below in FIG. 6), which can be translated vertically (i.e., in the Z-direction) with an accuracy of 1 $\mu$m by a linear precision translation stage known to those skilled in the art. The selection of the bonding sites on the substrate (i.e., in the X and Y directions) is conveniently controlled by a linear precision translation stage with an accuracy of 1 $\mu$m, also known to those skilled in the art. The selection of bonding sites can be accomplished through either the motion of this mechanical assembly or the motion of the IC chip, or a combination of both. As known to those skilled in the art, depending on the application, motions in the three directions can be either coupled together or decoupled as independent motions.

Having described several portions of the novel laser-driven microwelding apparatus of the present invention, attention is directed toward the third, i.e., a loop forming tool, which is used to form a wire loop linking the IC chip and the IC package.

Figure 5A:
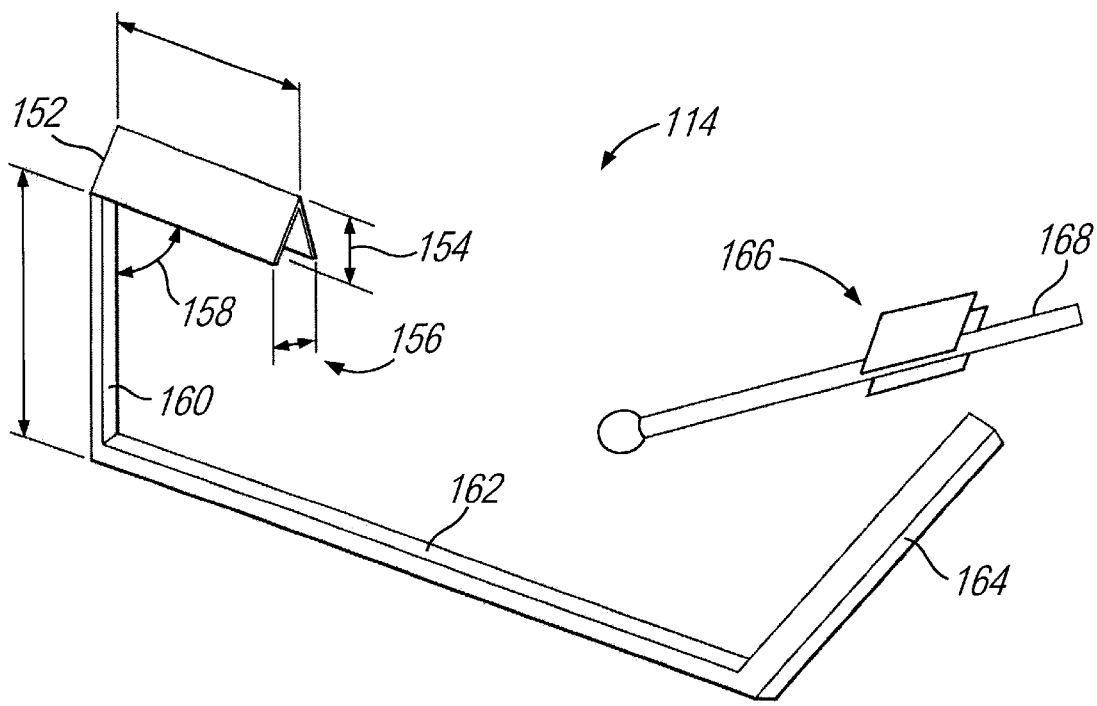
FIGS. 5A and 5B are perspective views illustrating two loop-forming tool embodiments in accordance with the present invention.

FIG. 5A shows an embodiment of the loop-forming tool 114, which may conveniently be made of metal, ceramic, or reinforced plastic material, or any combination of these materials. This loop-forming tool 114, or its equivalent, is used to form a wire loop for the present laser-driven microwelding or dual ball bonding system. The loop-forming tool 114 can be made substantially smaller and thinner in dimension than the conventional capillary bonding tool. As a result, the loop-forming tool 114 is more compatible with the miniaturized ball bond pitch enabled by the present invention.

The loop-forming tool 114 comprises a wire guide 152 and several connected arms. One of the arms (i.e., arm 164) may be connected to the aforementioned precision displacement subsystem through the Z-axis linear precision displacement setup, so that the loop-forming tool 114 can be vertically translated to desirable levels during the ball bonding operation without affecting the focus of the laser beams. In addition, to maximize its maneuverability, the loop-forming tool 114 may have four degrees of freedom of motion, i.e., X, Y, Z and $\omega$ (rotation).

The wire guide 152 captures and guides the wire during the loop-forming process. It is designed to facilitate the formation of a wire loop as well as to maintain the wire loop in a plane essentially vertical to the substrate. In the particular embodiment shown in FIG. 5A, the wire guide 152 takes the shape of a gable roof, although it may take any of several shapes, e.g., a gambrel roof or a cut-open pipe. The "height" 154 of the wire guide, or the depth of the groove when viewed upside down, is preferably not less than the size of the wire. To enhance the guiding capability of the wire guide 152, its inner surface may be roughened or corrugated. The angle of opening 156 of the wire guide 152 determines the range of wire size that can be handled by the loop forming tool 114; a typical value of 100°, together with roof edges of suitable lengths, would enable the wire guide 152 to handle coarse wires, e.g. 3-mil wires. The wire guide 152 forms an angle (the "loop angle") 158 with a first, essentially vertical arm 160. The loop angle 158 is critical in shaping the profile of the wire loop and, in accordance with the specific bonding operation requirement, can be either fixed or adjustable, e.g., from 30° to 90°, via a pivot linking the wire guide 152 and the arm 160. Finally, the length of the wire guide 152 provides a stable compressive force and guiding effect to the wire and is preferably 10% to 100% of the length of the first arm 160.

In the specific embodiment shown in FIG. 5A, the first arm 160 is connected to a second, essentially horizontal arm 162. The lengths of the arms 160 and 162 may be either fixed or adjustable on the basis of specific wire sizes and bonding needs. A convenient way to adjust the height of the wire loop is by adjusting the length of the first arm 160. Similarly, the length of the wire loop may be adjusted by the length of the horizontal arm 162. The second arm 162 is linked to a third arm 164, which in turn may be linked to the precision displacement subsystem (not shown in FIG. 5A).

Also shown in FIG. 5A is a wire clamping tool 166, which may be used to hold a wire 168 and to flatten the end of the wire 168 when necessary. This wire clamping tool 166 may be connected to a wire feeding mechanism, known to those skilled in the art, and should preferably be positioned as close to the loop-forming tool 114 as possible such that the wire loop length can be minimized.

Figure 5B:
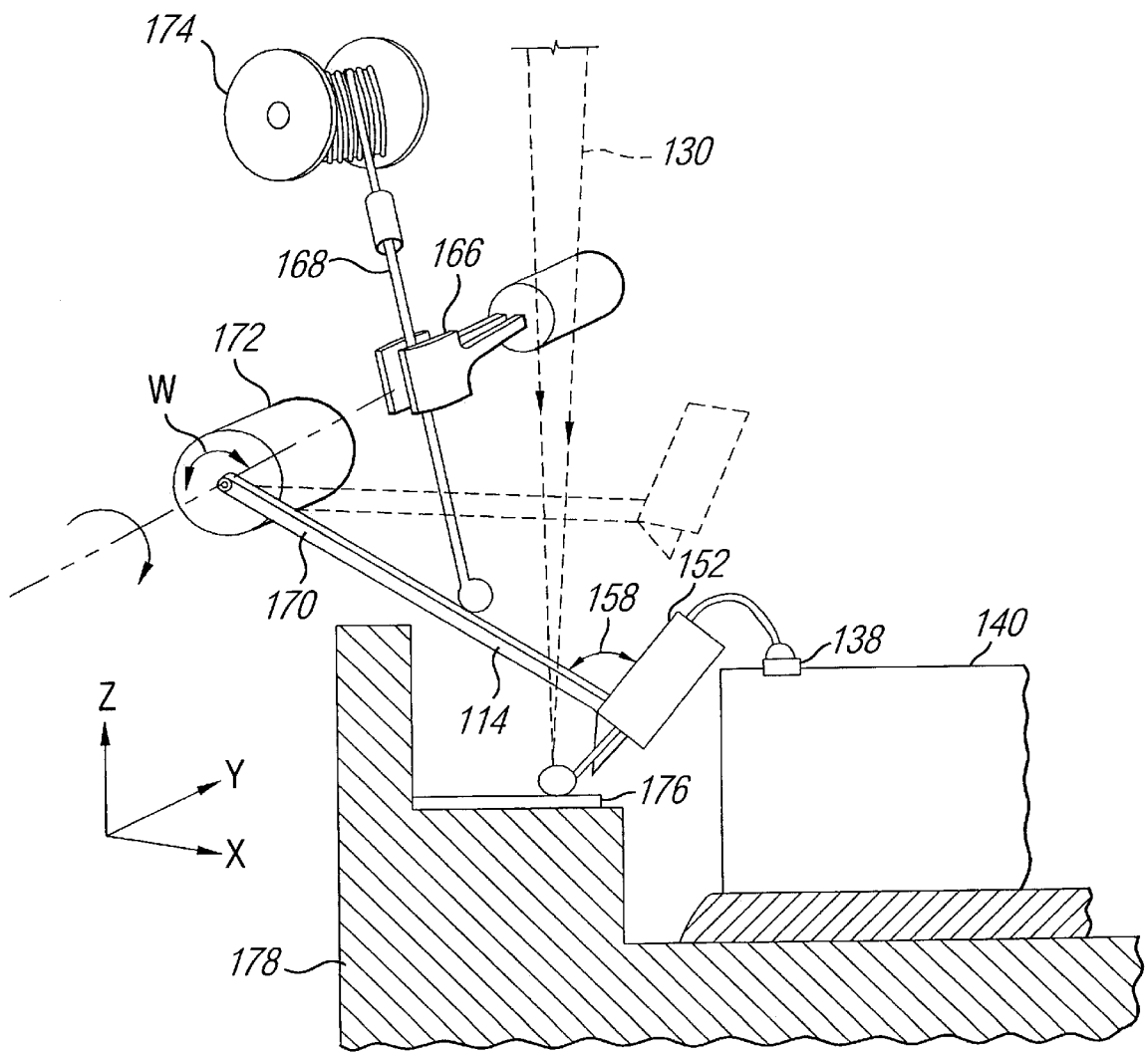

FIG. 5B depicts another embodiment of the loop forming tool 114, which may also be made of a variety of materials ranging from metal to reinforced plastics. Again, the loop-forming tool 114 can be made substantially smaller and thinner in dimension than the conventional capillary bonding tool. As a consequence, this loop-forming tool 114 is compatible with the miniaturized ball bond pitch espoused by the present invention.

In this specific embodiment of the loop forming tool 114, a wire guide 152 is directly connected to a motor-driven rotating shaft 172 via an arm 170. The wire guide 152 is used to capture and guide the wire during the loop-forming process. The wire guide 152 of the specific embodiment shown in FIG. 5B is essentially identical to that illustrated in FIG. 5A. For example, it may takes the shape of a gable roof or several other shapes, as discussed above; the inner surface of the wire guide 152 may be roughened or corrugated to enhance its guiding capability; and the angle 158 between the wire guide 152 and the arm 170 may be either fixed or adjustable depending on the specific bonding requirement. Finally, the arm 170 may have either a fixed or adjustable length depending on wire sizes and other bonding operation requirements.

A wire clamping tool 166 is shown in FIG. 5B. It holds a wire 168 from a prior-art wire feeding mechanism, e.g., a reel or a wire pool, 174. To illustrate the proximity of the loop forming tool 114, the wire clamping tool 166, and the bonding elements (e.g., a bond pad 138 of an IC chip 140 and a bonding finger 176 of an IC package 178) during operation, all of these are simultaneously shown in FIG. 5B. Note that the IC chip 140 may be attached to the IC package 178 via a die attach adhesive. Also shown in FIG. 5B is a laser beam 130 generated by the aforesaid laser/focus/monitoring subsystem, which beam 130 is focused upon a microwelding area during operation.

Figure 6:
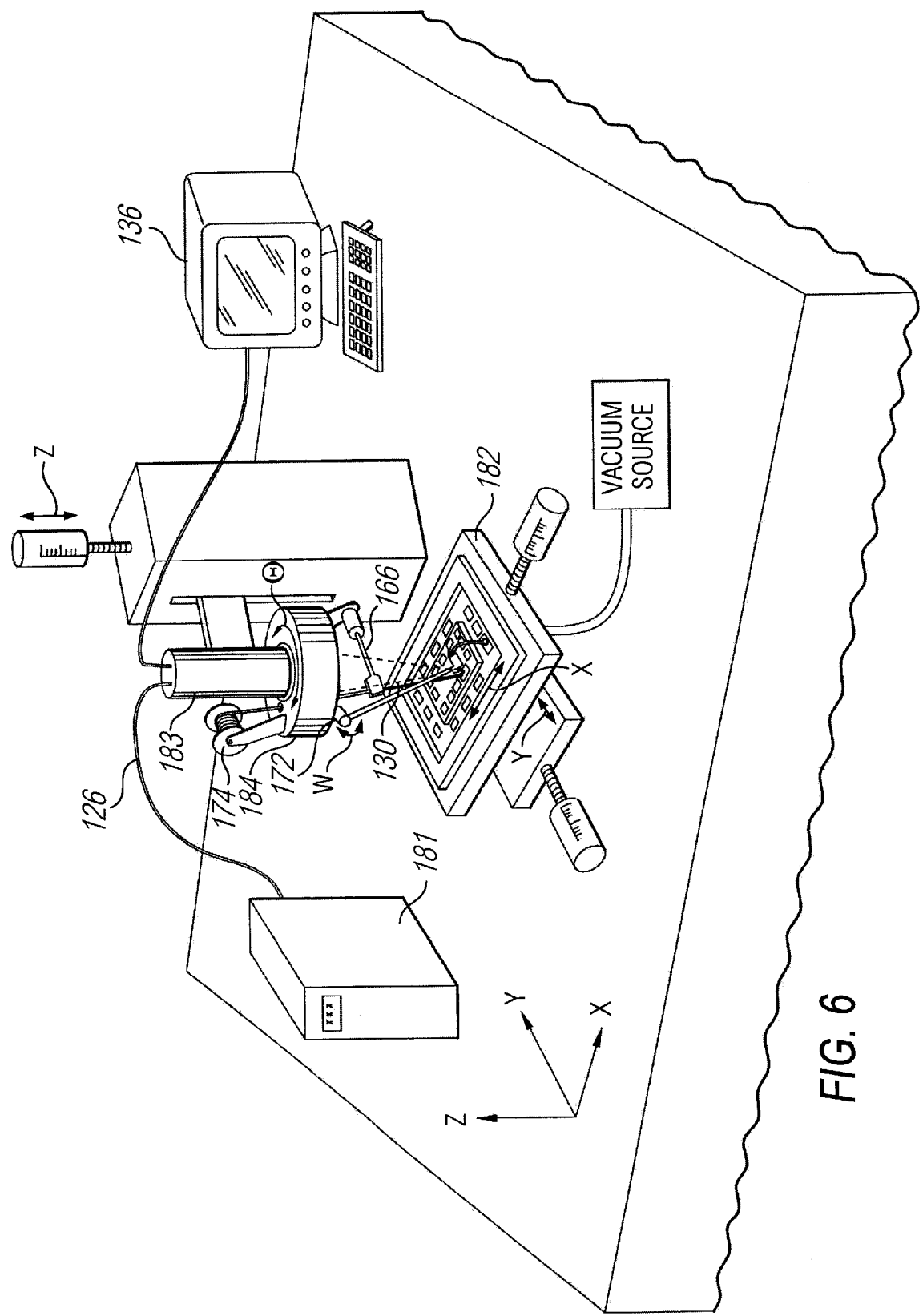
FIG. 6 is a perspective view illustrating a laser-driven microwelding system in accordance with the present invention.

FIG. 6 is a perspective view of a specific embodiment of the laser-driven microwelding system of the present invention. The coupled output beam 130 from both the pulsed source and the aiming laser source (both contained in a source box 181) is transmitted through an optical fiber 126 to the assembly 183 encompassing the aforesaid beam imaging assembly, the beamsplitter compartment and the CCD camera. As described above, this assembly 183 can be translated vertically (i.e., in the Z-direction) with an accuracy of 1 μm by a linear precision translation stage known to those skilled in the art. There are two optical outputs from this assembly 183, one being the coupled laser beam while the other being the split aiming beam transmitted to the monitor 136. Also shown in FIG. 6 are: an X,Y precision translation system 182, in which the X- and Y-direction motions may be independently controlled; a rotating shaft 172 connected to a loop forming tool 114; a second motor-driven rotator 184 affording the loop forming tool 114 another degree of rotational freedom; a wire clamping tool 166; a reel 174; and a substrate (e.g., IC chip) 140. Finally, the perforated platform on which the substrate is located is connected to a vacuum source (not shown) to hold substrate in place during bonding operation.

Having described the several subsystems of the novel laser-driven microwelding system, a discussion of the new dual ball bonding process is in order. See FIGS. 7A–7J.

Figure 7A:
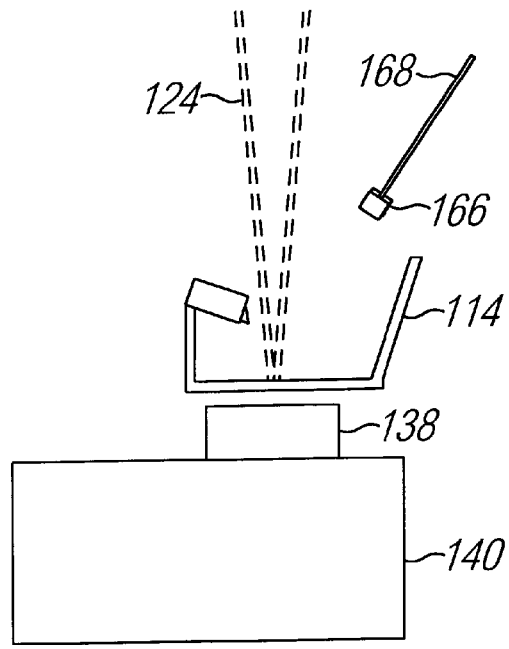

In the operation of the laser-driven microwelding apparatus of the present invention, the wire clamping tool 166 first flattens the tip of the wire 168 made of, e.g., copper, to increase the cross-sectional area of the wire 168 for more effective laser energy absorption; see FIG. 7A. Also shown in FIG. 7A are: a substrate 140, a bond pad 138 on the substrate, a loop-forming tool 114, and an aiming laser beam 124.

Figure 7B:
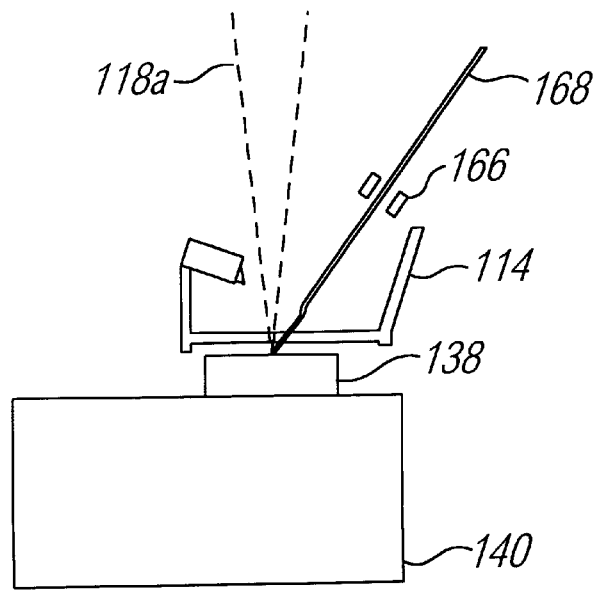
Figure 7C:
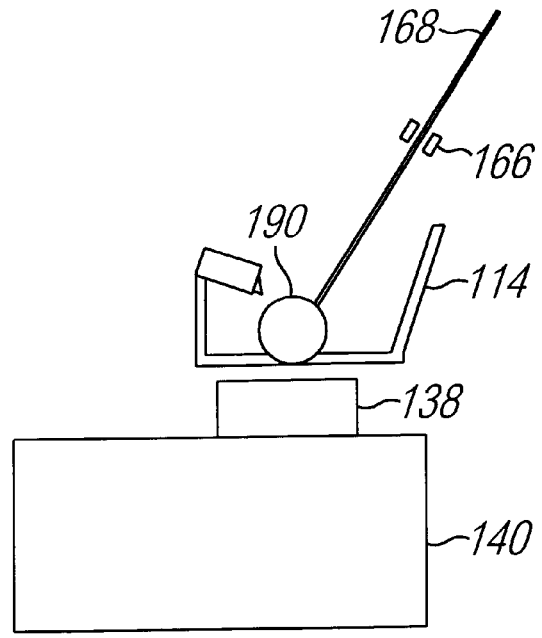
Figure 7D:
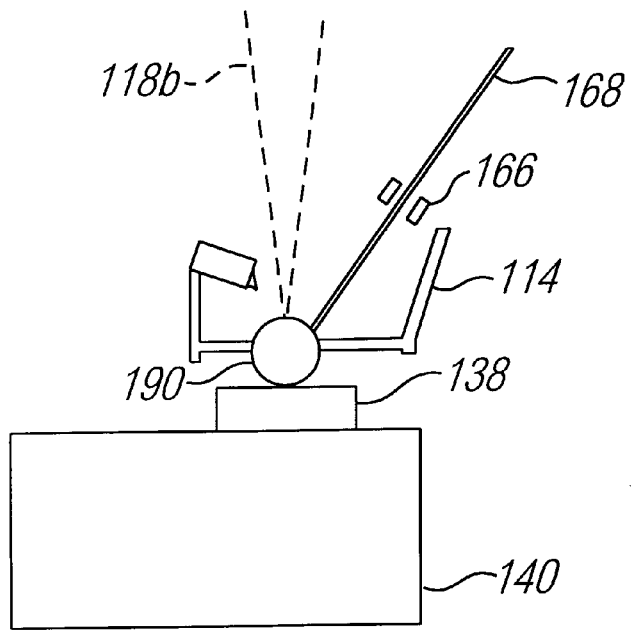
Figure 7E:
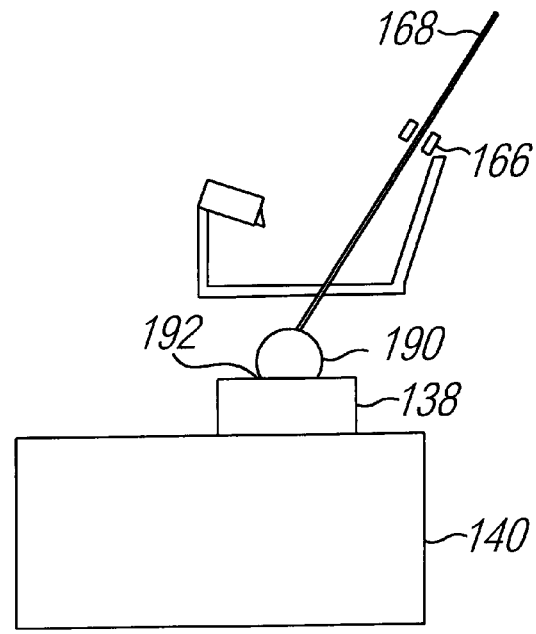

In FIG. 7B, the flattened portion of the wire 168 is moved toward the focal spot of the first laser beam 118a, resulting in the formation of a Cu ball 190 at the tip of the wire as shown in FIG. 7C. Further advancing (threading) the wire slightly presses the Cu ball 190 against the bond pad 138; see FIG. 7D. Also in FIG. 7D, a second laser pulse 118b irradiates the Cu ball 190 to form a strong alloy ball bond 192 between the Cu ball 190 and the aluminum bond pad 138. This ball bond 192 is shown in FIG. 7E. Typically, an approximately 2× to 3× ratio between the diameter of the focused beam spot and that of the ball bond was observed.

Figure 7F:
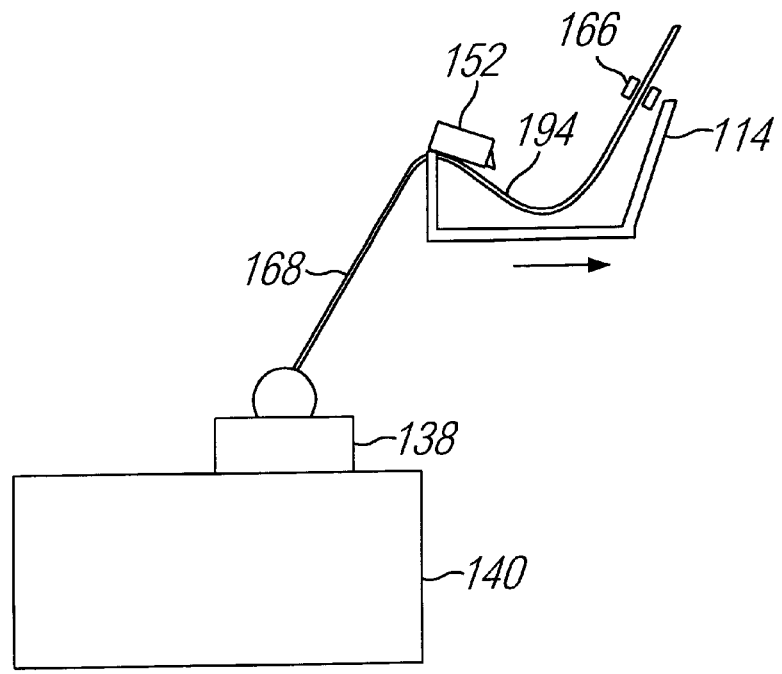

In FIG. 7F, the loop-forming tool 114 is shown raised and horizontally displaced, unreeling a small length of wire 168 while capturing the wire within the wire guide 152. A wire loop 194 is thus formed by the movement of the loop-forming tool 114 relative to the substrate 140. The wire clamping tool 166 is then actuated to flatten the wire 168 at a pre-selected location before it releases this flattened section 196. In FIG. 7G, the loop forming tool 114 holds the wire down so that the flattened portion 196 resides directly above, but does not contact, the bond pad 176 of an IC package 178. This prevents the package bond pad 176 from being damaged by the laser. A third laser pulse 118c then irradiates the flattened portion of the wire to break the Cu wire 168 into two segments, with a new Cu ball formed at each broken end 202 and 204; see FIG. 7H.

Figure 7I:
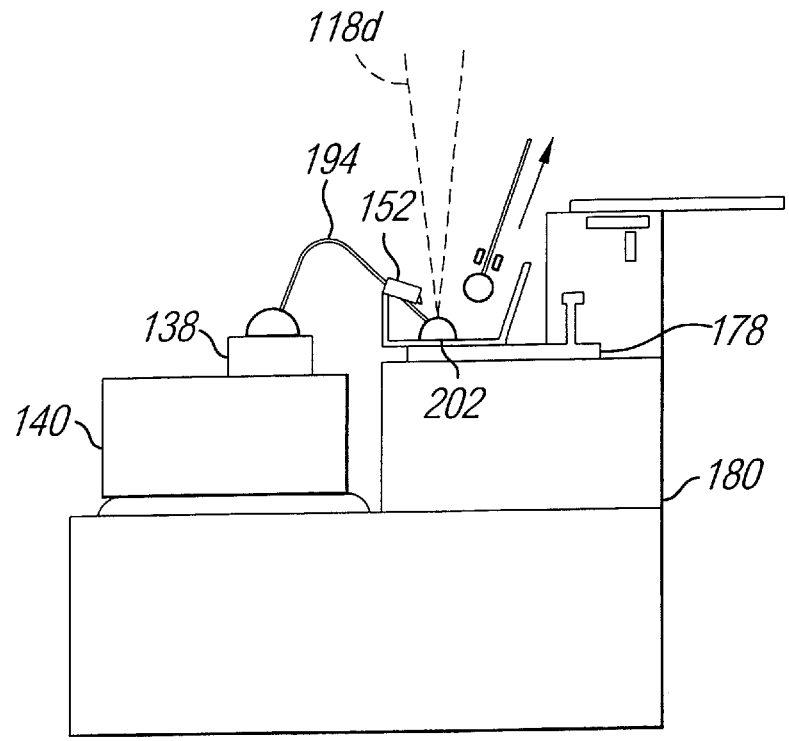
Figure 7J:
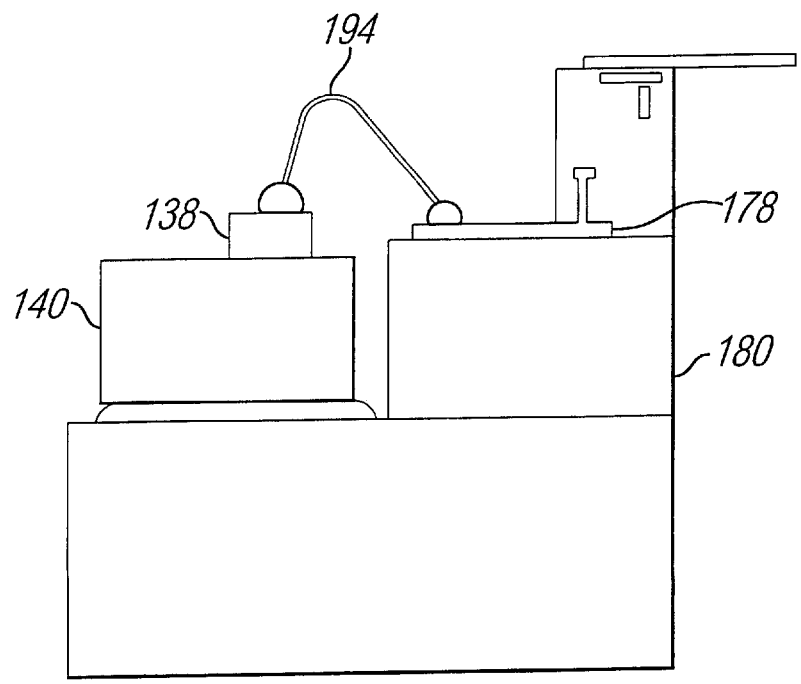

In FIG. 7I, the loop forming tool 114 is again lowered, with the wire held by the wire guide 152 also lowered, and thereby presses the copper ball 202 against the package bond pad 178. Finally, a fourth laser pulse 118d fuses the copper ball 202 of the wire loop 194 with the packaging bond pad 178. Thus, a closed Cu wire loop 194 is completed with high strength ball bonds at both the IC chip bond pad 138 and the package bond pad 178; see FIG. 7J. The loop-forming tool 114 is now ready to move on to the next bonding position for the formation of the next wire loop.

To simplify laser design and operation, all the above four laser pulses 118a, 118b, 118c and 118d may be of the same power density and duration. That is, for the formation of dual copper-aluminum ball bonds, a laser having a power density of approximately $4.7 \times 10^5$ W/cm$^2$ may be activated four times, each for a duration of approximately 0.5 millisecond.

Having described the novel dual ball bonding process, attention is turned to a new metal bumping process using the novel laser-driven microwelding system. This new ball bumping process, as depicted in FIGS. 8A–8G, may be carried out without the loop-forming tool shown in FIG. 5A or 5B, although using it would accelerate the auto-focusing process by pre-setting the loop forming tool at the focal plane of the coupled laser beam.

Figure 8A:
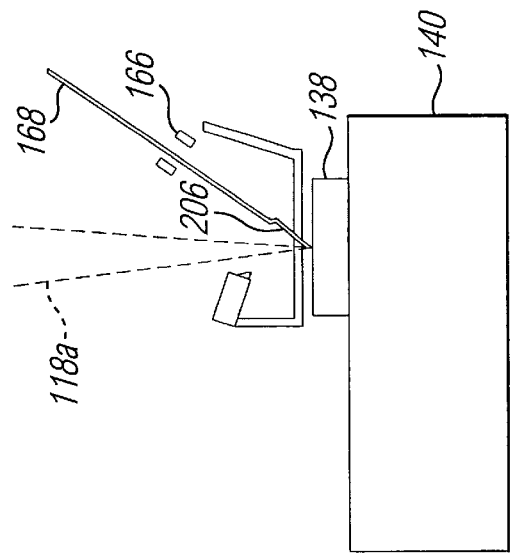
FIGS. 8A–8G are schematic illustrations of a laser-driven metal bumping process in accordance with the present invention.

Referring to FIG. 8A, the wire clamping tool 166 first flattens the wire 168, increasing the wire cross-sectional area thereof to intercept laser energy more efficiently. The aiming laser beam 124 may be used to locate the focal spot of the high-power laser beam. The wire may be made of copper, gold, palladium, or a number of other metals such as molybdenum or solder.

Figure 8B:
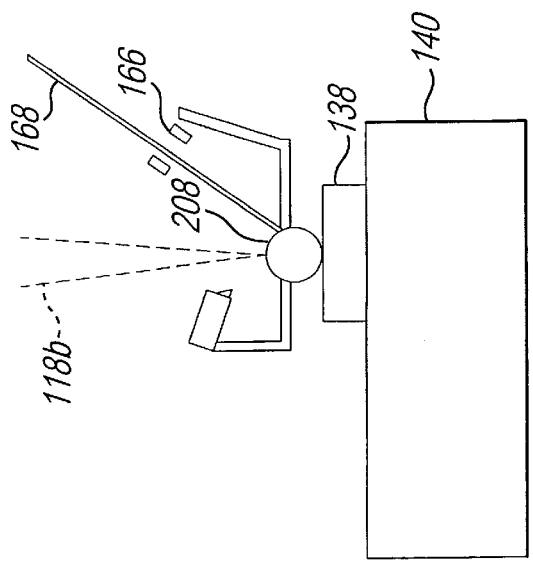
Figure 8C:
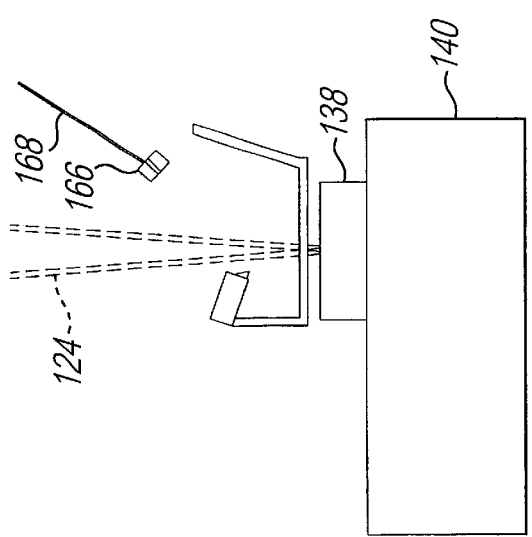
Figure 8D:
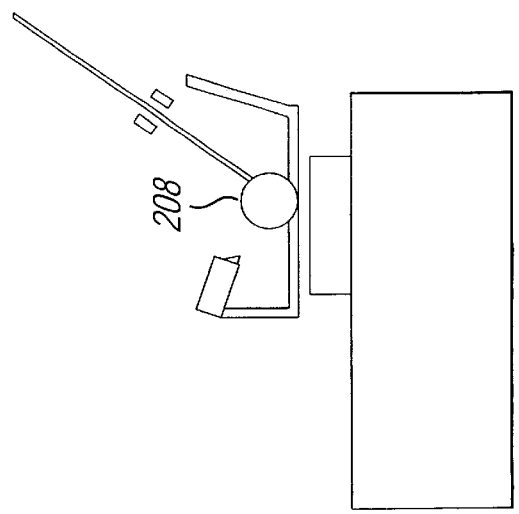

In FIG. 8B, the flattened portion 206 of the wire 168 is moved toward the focal spot of the laser. A first laser pulse 118a results in the formation of a Cu ball 208 at the tip of the wire 168; see FIG. 8C. Further threading the wire makes the Cu ball 208 touch the bond pad 138 with a light downward pressure. A second laser pulse 118b irradiates the ball 208 to form a strong alloy bond between the copper ball 208 and the aluminum bond pad 138; see FIG. 8D.

Figure 8E:
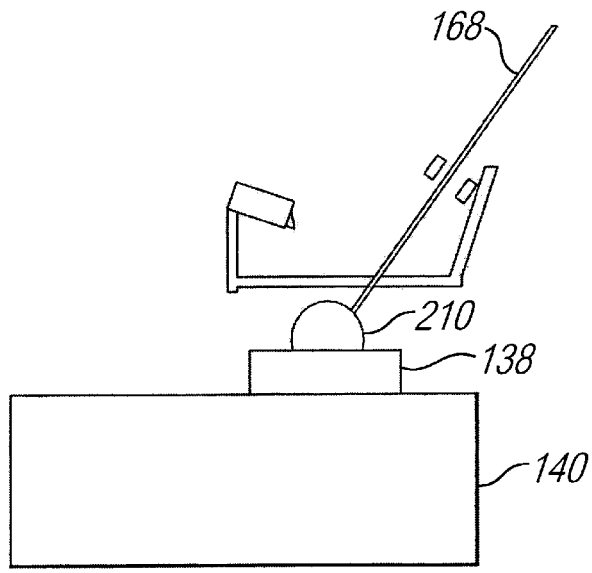
Figure 8F:
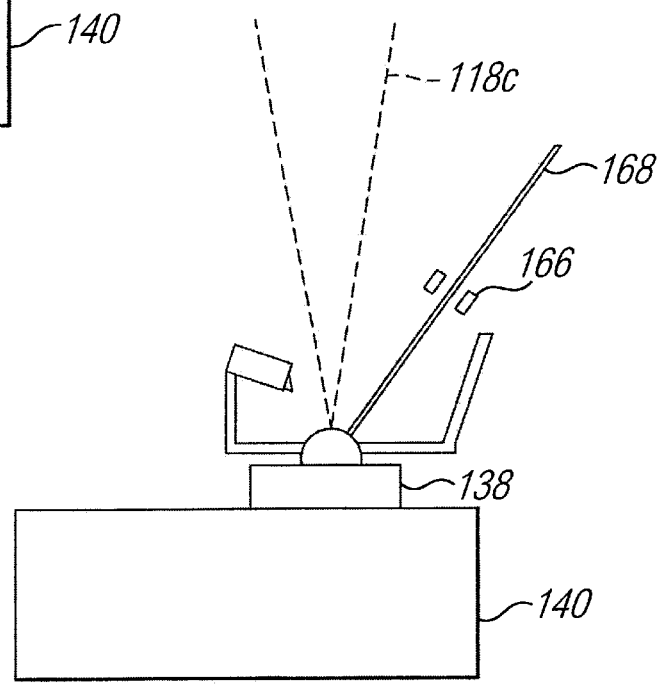
Figure 8G:
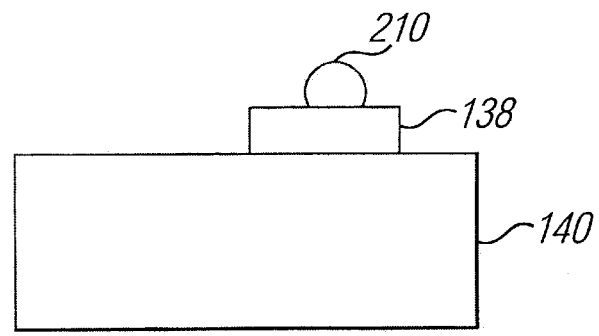

In FIG. 8E, the Cu ball bonded to the bond pad 138 by the second laser pulse now takes the shape of essentially a hemisphere 210. Again, the presence of the loop-forming tool 114 facilitates and accelerates the auto-focusing process. A small length of wire is unreeled, before the wire clamp 166 is actuated again to break the copper wire 168 right above the copper bump 210. Alternatively, a third laser pulse 118c may irradiate the wire 168 right above the bump 210, separating the wire 168 and the bump 210; see FIG. 8F. This third laser pulse 118c also partially melts the top portion of the bump 210 so that surface tension can restore the bump into an essentially hemispherical shape; see FIG. 8G.

Note that the novel bumping process of the present invention does not require the seed and barrier layers which are required by the conventional bumping process. This bumping process also requires no use of flux.

Having described the new ball bonding process and the new bumping process, attention is now turned to a new TAB assembly process using the new laser-driven microwelding system of the present invention. This new TAB assembly process is depicted in FIG. 9.

Figure 9A:
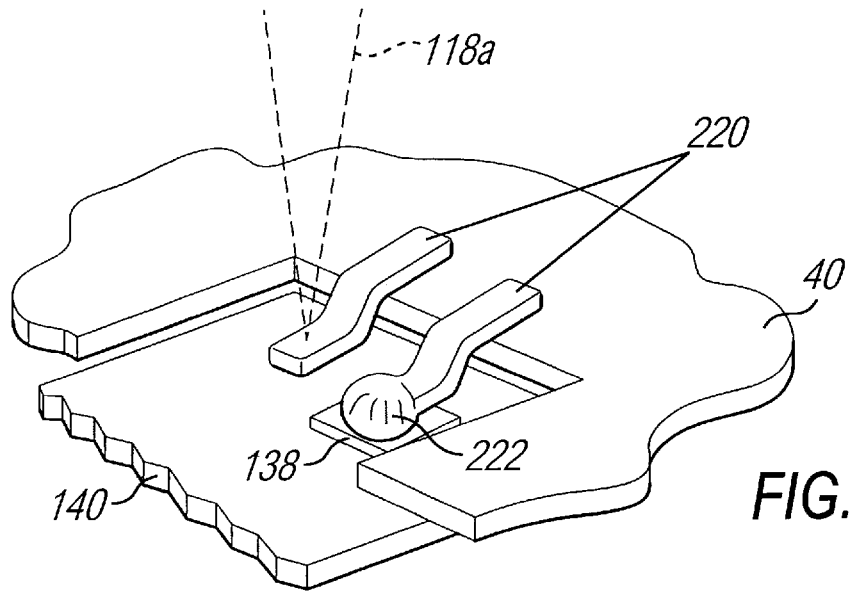
FIGS. 9A–9C are schematic illustrations of a laser-driven TAB assembly process in accordance with the present invention.
Figure 9B:
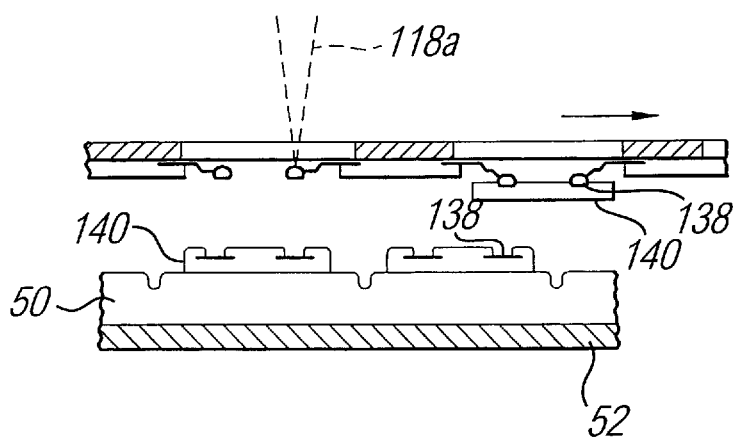

In the present automated TAB assembly process, Cu ball are preferably formed at the tip of all the Cu leads within the same run before these Cu ball are fused with the corresponding bond pads of the IC chip. Refer to FIG. 9A. A laser pulse 118a focuses directly upon the tip of a Cu lead 220 on a TAB tape 40 and melts it to form a Cu ball 222. The Cu ball 222 is later brought into contact with a bond pad 138 of an IC chip 140 with a slight compression. As known to those skilled in the art, IC chip 140 may be attached to a sticky or wax layer 50 on a tape carrier 52; see FIG. 9B. The IC chip and its bond pads are aligned with the Cu leads of the TAB tape using optical alignment known to one skilled in the art (thus not shown). A second laser pulse 118b then irradiates the Cu ball 222 to melt the Cu ball again and form an alloy with the matched bond pad 138.

Figure 9C:
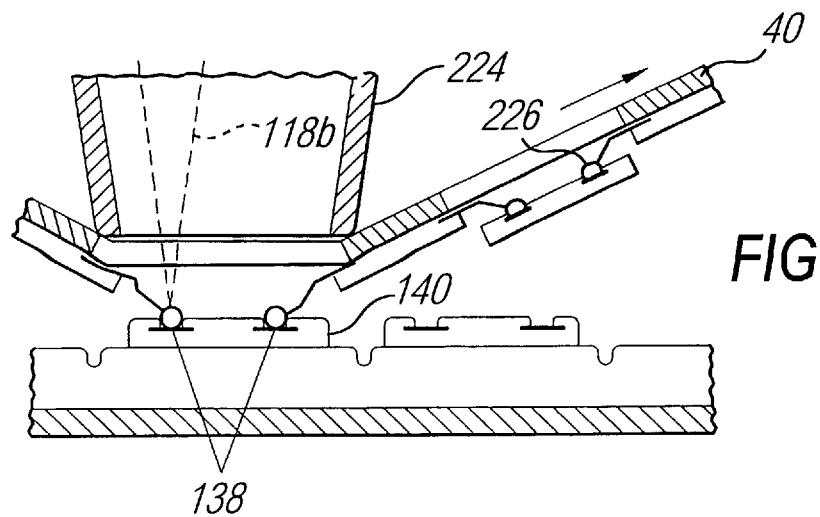

In FIG. 9C, the TAB tape 40 is gently deflected toward the IC chip surface by a hollow gang deflector 224 so that each of the copper balls 222 is slightly compressed against its corresponding bond pad 138. This gang deflector 224 provides a slight physical displacement to the TAB tape to ensure a slightly compressive contact between the Cu ball and the bond pad. The gang deflector 224 can take various shapes, e.g., the shape of a square hollow cylinder as shown in FIG. 9C. The contact surface between the gang deflector 224 and the TAB tape 40 can also take various shapes, e.g., a flat surface or a four-point contact at the corners of a square hollow cylinder gang deflector.

A short laser pulse 118b subsequently irradiates and melts a Cu ball 222. The molten Cu ball 222 amalgamates with the corresponding bond pad 138 during solidification, forming an alloy metal bond. The strength of these solder-free alloy bonds are much stronger than those formed by conventional TAB assembly methods. Notably, the novel TAB assembly process of the present invention does not require any photolithography process or exposure to plating chemicals, or the use of flux. Nor does the present TAB process require any of the thin film deposition steps dictated by the conventional TAB technique.

Although the present invention has been described above in terms of several specific embodiments, it is anticipated that alterations and modifications thereof will no doubt become apparent to those skilled in the art having read the above detailed description of the embodiments. It is therefore intended that the following claims be interpreted as covering all such alterations and modifications as fall within the true spirit and scope of the invention.

What is claimed is:

1. A method of interconnecting through dual-ball bonding a first and a second bonding pads spatially separated from each other, comprising the steps of:

provide a length of an electrically conductive material;

irradiating with a first laser pulse a first end portion of said length of said conductive material causing said first end portion to momentarily change state and deform into an essentially spherical shape;

placing said deformed first end portion into contact with said first bonding pad;

irradiating with a second laser pulse said deformed first end portion and said first bonding pad to create a first microweld ohmically connecting said deformed first end portion to said first bonding pad;

displacing said length of said conductive material away from said first bonding pad to form a wire loop of said conductive material having a first end portion welded to said first bonding pad and a second end portion integrally connected to said length of said conductive material;

irradiating said length of said conductive material with a third laser pulse at said second end portion of said wire loop to sever said wire loop from said length of said conductive material and to deform said second end portion of said wire loop into an essentially spherical shape;

placing said deformed second end portion of said wire loop into contact with said second bonding pad; and irradiating with a fourth laser pulse said deformed second end portion of said wire loop and said second bonding pad to create a second microweld ohmically connecting said deformed second end portion of said wire loop to said second bonding pad, thereby causing said wire loop to interconnect said first and said second bonding pads.

2. A method as recited in claim 1 wherein, prior to irradiating with said first laser pulse said first end portion of said length of said conductive material, said first end portion is mechanically flattened to increase the area exposed to said first laser pulse.

3. A method as recited in claim 2 wherein, prior to irradiating with said third laser pulse said length of said conductive material at said second end portion of said wire loop, said second end portion of said wire loop is mechanically flattened to increase the area exposed to said third laser pulse.

4. A method as recited in claim 3 wherein said electrically conductive material is selected from the group consisting of aluminum, gold, copper and palladium.

5. A method as recited in claim 1 wherein irradiating said length of said conductive material at said second end portion of said wire loop creates a new first end portion of the remaining length of said conductive material, said new first end portion deformed into an essentially spherical shape.

6. A method as recited in claim 5 wherein, prior to irradiating with said first laser pulse said first end portion of said length of said conductive material, said first end portion is mechanically flattened to increase the area exposed to said first laser pulse.

7. A method as recited in claim 6 wherein, prior to irradiating with said third laser pulse said length of said conductive material at said second end portion of said wire loop, said second end portion of said wire loop is mechanically flattened to increase the area exposed to said third laser pulse.

8. A method as recited in claim 7 wherein said electrically conductive material is selected from the group consisting of aluminum, gold, copper and palladium.

9. A method as recited in claim 1 wherein said electrically conductive material is selected from the group consisting of aluminum, gold, copper and palladium.

10. A method for bonding a tape-automated bonding (TAB) tape having a plurality of leads to an electronic element having a plurality of bonding areas, comprising the steps of:
   irradiating the end of each of said leads with a first laser beam to deform each of said ends into an essentially spherical shape;
   contacting each said deformed lead end with one of said bonding areas; and
   irradiating with a second laser beam each said deformed lead end and said bonding area in contact therewith to create a microweld between said deformed lead end and said bonding area.

11. An apparatus for forming a bump made of a portion of a wire on a surface, comprising:
   a first laser source for generating a first laser beam;
   a second laser source for generating a second laser beam;
   means for coupling said first laser beam and said second laser beam;
   means for projecting said laser beams to said surface;
   means for deforming an end portion of said wire;
   means for moving one or more of said laser beams, said deforming means, said wire and said surface; and
   means for monitoring and controlling said laser beams.

12. An apparatus as recited in claim 11, further comprising:
   means for separating said wire from said surface.

13. A method for forming an essentially hemispherical, electrically conductive bump on an electrically conductive surface, comprising the steps of:
   providing a length of an electrically conductive material;
   irradiating with a first laser pulse an end portion of said length of said conductive material to deform said end portion into an essentially spherical shape;
   placing said deformed end portion in contact with a portion of said conductive surface;
   irradiating with a second laser pulse said deformed end portion and said portion of said conductive surface to form said bump, said bump welded to said conductive surface and connected to said length of said conductive material; and
   irradiating with a third laser pulse the top portion of said bump to separate said bump from said length of said conductive material.

14. A method as recited in claim 13 wherein said electrically conductive material is selected from the group consisting of aluminum, gold, copper, palladium, molybdenum and solder.

15. An apparatus for bonding a wire to both a first bonding pad and a second bonding pad through dual-ball bonding, said first and said second bonding pads spatially separated from each other, comprising:
   a first laser source for generating a first laser beam;
   a second laser source for generating a second laser beam;
   means for coupling said first laser beam and said second laser beam;
   means for projecting said laser beams to the surface of said first bonding pad and the surface of said second bonding pad;
   means for forming a wire loop out of a portion of said wire;
   means for clamping portions of said wire;
   means for moving one or more of said laser beams, said clamping means, said means for forming said wire loop, said wire and said wire loop; and
   means for monitoring and controlling said laser beams.

16. An apparatus as recited in claim 15, further comprising:
   means for moving one or more of said first bonding pad and said second bonding pad.

* * * * *